(12) United States Patent
Chang (10) Patent No.: US 9,704,939 B2
(45) Date of Patent: Jul. 11, 2017

(54) ORGANIC LIGHT EMITTING DIODE DISPLAY PANEL AND DISPLAY DEVICE WITH SAME

(71) Applicant: HON HAI PRECISION INDUSTRY CO., LTD., New Taipei (TW)

(72) Inventor: Jen-Tsorng Chang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/945,953

(22) Filed: Nov. 19, 2015

(65) Prior Publication Data
US 2016/0351650 A1 Dec. 1, 2016

(30) Foreign Application Priority Data
May 29, 2015 (CN) .......................... 2015 1 0285564

(51) Int. Cl.
*H01L 51/00* (2006.01)
*H01L 27/32* (2006.01)
*H01L 23/48* (2006.01)

(52) U.S. Cl.
CPC ........ *H01L 27/3276* (2013.01); *H01L 23/481* (2013.01); *H01L 27/3267* (2013.01); *H01L 27/3262* (2013.01)

(58) Field of Classification Search
CPC ............. H01L 27/3248; H01L 27/3262; H01L 27/3267; H01L 27/3276; H01L 23/481
See application file for complete search history.

(56) References Cited

U.S. PATENT DOCUMENTS

| 9,356,087 | B1* | 5/2016 | Lee ..................... H01L 27/3276 |
| 9,476,881 | B2* | 10/2016 | Rutter .................. G01N 33/573 |
| 9,515,099 | B2* | 12/2016 | Kwon ................. H01L 27/1244 |
| 9,577,220 | B2* | 2/2017 | Naijo .................. H01L 51/5259 |
| 2010/0072579 | A1* | 3/2010 | Thies ................ H01L 21/76898 257/621 |
| 2010/0148210 | A1* | 6/2010 | Huang .................. H01L 33/486 257/99 |
| 2010/0156273 | A1* | 6/2010 | Utsunomiya ....... H01L 27/3276 313/498 |
| 2011/0193240 | A1* | 8/2011 | Farooq .................... B32B 15/20 257/774 |
| 2013/0256735 | A1* | 10/2013 | Kim ........................ H01L 33/62 257/99 |

(Continued)

*Primary Examiner* — Victoria K Hall
(74) *Attorney, Agent, or Firm* — Steven Reiss (57) ABSTRACT

An OLED display panel includes a substrate, a light emitting structure and a driving structure. The substrate defines an electrical conductive hole. The light emitting structure is located at a side of the substrate. The light emitting structure includes a first electrode, a second electrode and an organic light emitting layer located between the first electrode and the second electrode. The driving structure includes a row drive circuit line and a column drive circuit line. The substrate includes a face opposite to the light emitting structure. The row drive circuit line is coupled to the face of the substrate. The first electrode is electrically coupled to the row drive circuit line via the electrical conductive hole. The column drive circuit line is coupled to the light emitting structure to be electrically coupled to the second electrode. A display device with the OLED display panel is also provided.

20 Claims, 5 Drawing Sheets

(56) References Cited

U.S. PATENT DOCUMENTS

| | | | | |
|---|---|---|---|---|
| 2014/0049449 A1* | 2/2014 | Park | ............... | G09G 5/00 |
| | | | | 345/1.3 |
| 2014/0300529 A1* | 10/2014 | Kim | ............... | H01L 27/326 |
| | | | | 345/80 |
| 2015/0008396 A1* | 1/2015 | Naijo | ............... | H01L 51/0097 |
| | | | | 257/40 |
| 2015/0206929 A1* | 7/2015 | Sato | ............... | H01L 27/32 |
| | | | | 257/40 |
| 2016/0155788 A1* | 6/2016 | Kwon | ............... | H01L 27/3276 |
| | | | | 257/40 |
| 2016/0351650 A1* | 12/2016 | Chang | ............... | H01L 27/3276 |
| 2017/0023979 A1* | 1/2017 | Yamazaki | ............... | G06F 1/1652 |

* cited by examiner

ORGANIC LIGHT EMITTING DIODE DISPLAY PANEL AND DISPLAY DEVICE WITH SAME

FIELD

The subject matter herein generally relates to display technology, and particularly to an organic light emitting diode (OLED) panel and a display device with the OLED panel.

BACKGROUND

With the development of display technology, large screen display as one kind of flat panel displays has a certain consumer market. Generally, the larger screen display is realized by combining two or more display screens together.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure is described in relation to an OLED display panel. The OLED display panel can include a substrate, a light emitting structure and a driving structure. The substrate defines an electrical conductive hole. The light emitting structure is located at a side of the substrate. The light emitting structure can include a first electrode, a second electrode and an organic light emitting layer located between the first electrode and the second electrode. The driving structure can include a row drive circuit line and a column drive circuit line. The substrate includes a face opposite to the light emitting structure. The row drive circuit line is coupled to the face of the substrate. The first electrode is electrically coupled to the row drive circuit line via the electrical conductive hole. The column drive circuit line is coupled to the light emitting structure, whereby the column drive is electrically coupled to the second electrode.

The present disclosure is described further in relation to a display device. The display device can include two display panels splicing together and an OLED display panel. Each of the display panels can include a display area and a rim area coupled to the display area. The rim areas of the two display panels are coupled to each other and collectively form a splicing area between the display areas of the two display panels. The OLED display panel is coupled to the display panel and entirely covers the splicing area. The OLED display panel includes a display portion. The OLED display panel can include a substrate, a light emitting structure and a driving structure. The substrate defines an electrical conductive hole. The light emitting structure is located at a side of the substrate. The light emitting structure can include a first electrode, a second electrode and an organic light emitting layer located between the first electrode and the second electrode. The driving structure can includes a row drive circuit line and a column drive circuit line. The substrate includes a face opposite to the light emitting structure. The row drive circuit line is coupled to the face of the substrate. The first electrode is electrically coupled to the row drive circuit line via the electrical conductive hole. The column drive circuit line is coupled to the light emitting structure, whereby the column drive is electrically coupled to the second electrode.

Figure 1:
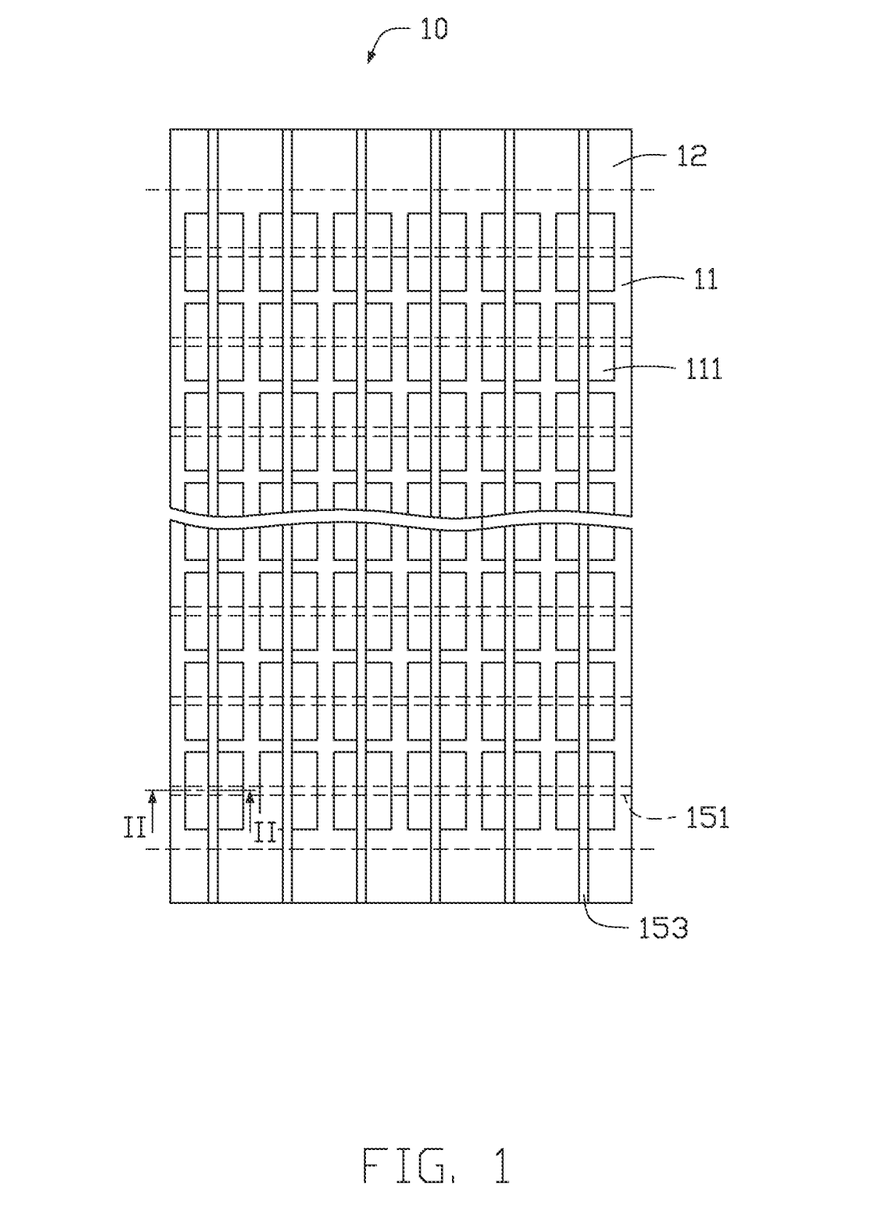
FIG. 1 is a plan view of an OLED display panel in accordance with an embodiment of the present disclosure.

FIG. 1 illustrates an OLED display panel 10 of an embodiment of the present disclosure. The OLED display panel 10 can include a display portion 11 and two frame portions 12 located at two opposite sides of the display portion 11. In the illustrated embodiment, the OLED display panel 10 is in shape of a substantially rectangular strip.

The OLED display panel 10 can have a thickness less than 2 millimeters.

The display portion 11 can include a plurality of pixel units 111. The pixel units 111 are evenly spaced and arranged in an array including a plurality of rows and a plurality of columns. In the illustrated embodiment, each column of pixel units 111 extends from one of the frame portions 12 to the other of the frame portions 12 along a direction perpendicular to the two frame portions 12. In at least one embodiment, in each column, a number of the pixel units 111 can be 1-100. In the illustrated embodiment, the display portion 11 is in shape of a substantially rectangular strip.

Figure 2:
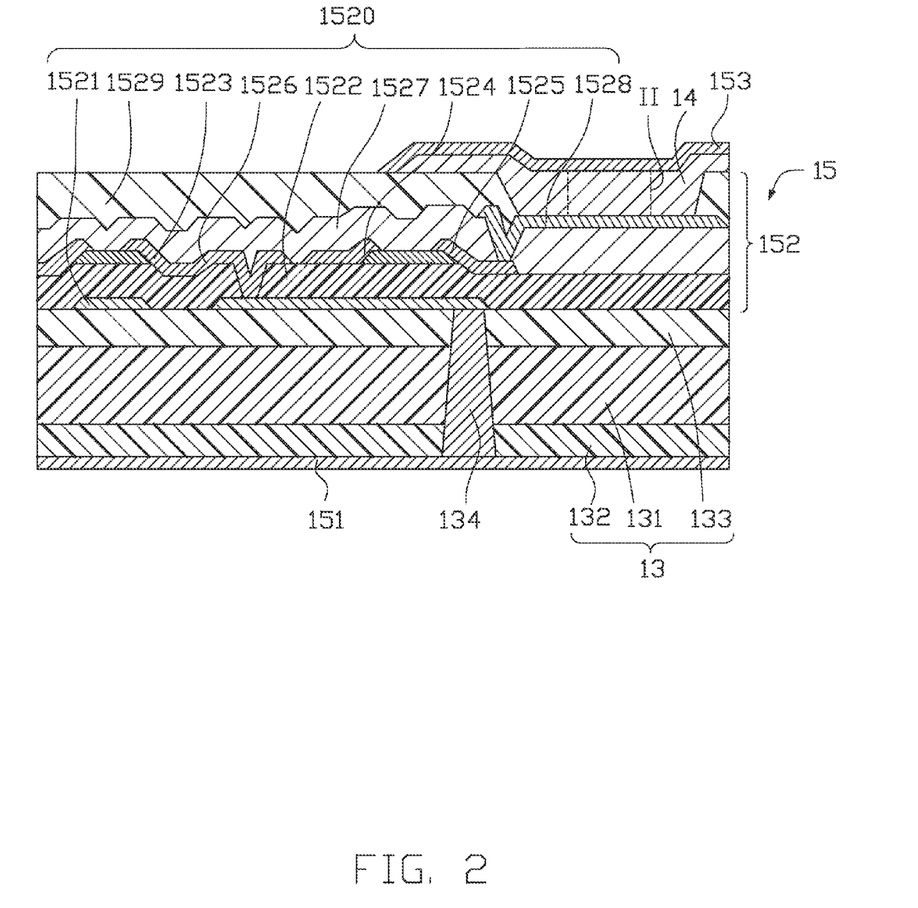
FIG. 2 is a cross sectional view of a display portion of the OLED display panel in FIG. 1 taken along a line II-II.

FIG. 2 illustrates that the display portion 11 can have a substrate 13, a plurality of light emitting structures 14 and a driving structure 15, stacked along a thickness direction.

A material of the substrate 13 can be glass or plastic or other insulating materials.

The substrate 13 can include a base 131, a first isolating layer 132 and a second isolating layer 133. The base 131 is located between the first isolating layer 132 and the second isolating layer 133.

The substrate 13 defines an electrical conductive hole 134 extending therethrough. In at least one embodiment, the electrical conductive hole 134 extends from the first isolating layer 133 to the second isolating layer 132. The electrical conductive hole 134 extends through the base 131, the first isolating layer 132 and the second isolating layer 133. The electrical conductive hole 134 has diameters thereof gradually deceased along a direction from the first isolating layer 132 to the second isolating layer 133.

The light emitting structures 14 are corresponding to the pixel units 111 one-to-one. Each light emitting structure 14 is located at a side of the substrate 13. In at least one embodiment, each light emitting structure 14 has a light emitting face opposite to the substrate 13. When the light emitting structure 14 emits lights, a light direction of the lights emits away from the substrate 13.

Figure 3:
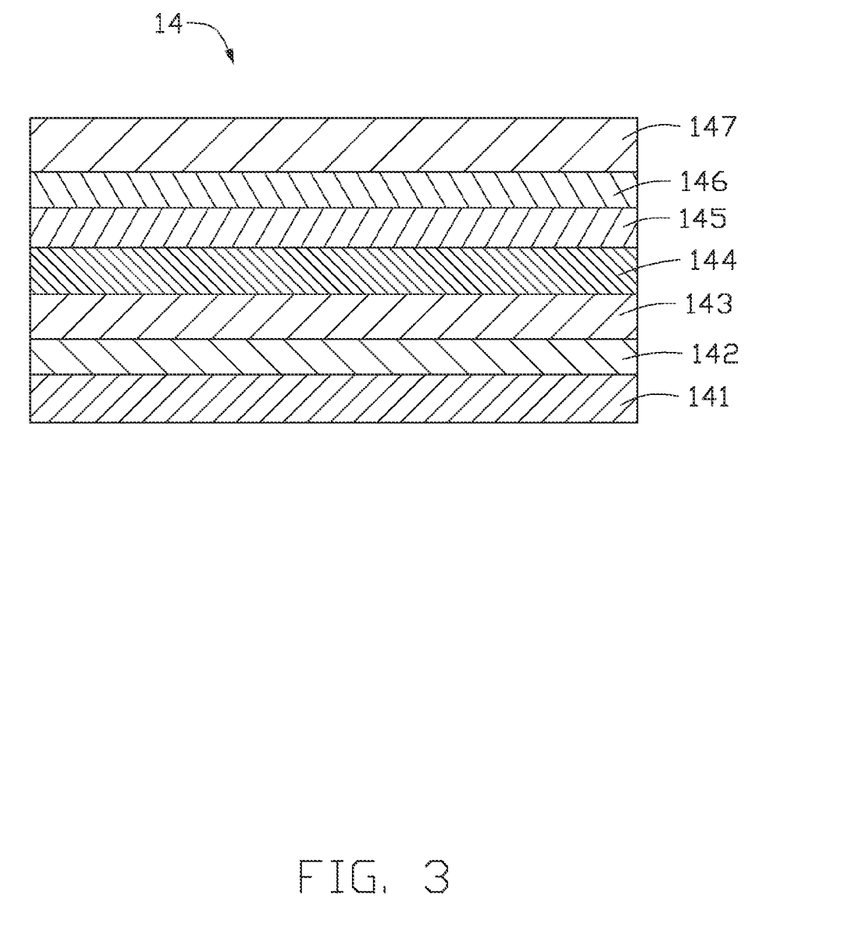
FIG. 3 is an enlarged view of a part II in FIG. 2.

FIG. 3 illustrates that the light emitting structure 14 can successively include a first electrode 141, a hole injection layer 142, a hole transport layer 143, an organic light emitting layer 144, an electron transport layer 145, an electron injection layer 146 and a second electrode 147. The first electrode 141, the hole injection layer 142, the hole transport layer 143, the organic light emitting layer 144, the electron transport layer 145, the electron injection layer 146 and the second electrode 147 are vertically stacked. A distance between the first electrode 141 and the substrate 13 is less than that between the second electrode 147 and the substrate 13.

FIG. 2 illustrates that the driving structure 15 can include a plurality of row drive circuit lines 151, a thin film transistor array 152 and a plurality of column drive circuit lines 153.

The plurality of row drive circuit lines 151 are parallel arranged. The row drive circuit lines 151 are coupled to a side of the substrate 13 remote from the light emitting structures 14. The row drive circuit lines 151 are electrically coupled to the electric conductive hole 134. In at least one embodiment, the row drive circuit lines 151 are coupled to an outer face of the second isolating layer 132.

The thin film transistor array 152 is coupled between the light emitting structures 14 and the substrate 13. The thin film transistor array 152 can include a plurality of thin film transistors 1520 arranged in an array. The plurality of thin film transistors 1520 correspond to the light emitting structures 14 on a one-to-one basis. The first electrode 141 of each light emitting structure 14 is electrically coupled to the electric conductive hole 134 via a corresponding thin film transistor 1520. The electrical conductive hole 134 has diameters thereof decreased from the row drive circuit line 151 to the thin film transistor 1520.

Each thin film transistor 1520 can include a gate electrode 1521, a gate insulating layer 1522, an active layer 1523, a source electrode 1524, a drain electrode 1525, a signal line 1526, an isolating layer 1527, a pixel electrode 1528 and a passivation layer 1529.

In at least one embodiment, the gate electrode 1521 is coupled on the second isolating layer 133. The gate electrode 1521 is electrically coupled to the row drive circuit line 151 via the electrical conductive hole 134.

The gate electrode 1521 is coupled between the gate insulating layer 1522 and the second isolating layer 133.

The active layer 1523 is coupled on the gate insulating layer 1522.

The source electrode 1524, the drain electrode 1525 and the signal line 1526 are coupled to gate insulating layer 1522. The source electrode 1524, the drain electrode 1525 and the signal line 1526 are located at a side of the active layer 1523.

The signal line 1526 is electrically coupled to the gate electrode 1521. In at least one embodiment, the gate insulating layer 1522 defines a through hole, the signal line 1526 has a portion therein received in the through hole and electrically coupled to the gate electrode 1521.

The isolating layer 1527 is coupled to the gate insulating layer 1522 and the active layer 1523.

The pixel electrode 1528 is coupled to the isolating layer 1527, and is electrically coupled to the drain electrode 1525. In at least one embodiment, the isolating layer 1527 defines a through hole, the pixel electrode 1528 has a portion therein received in the through hole and electrically coupled to the drain electrode 1525.

The passivation layer 1529 is coupled to the isolating layer 1527 and the pixel electrode 1528. The passivation layer 1529 exposes the pixel electrode 1528 to the light emitting structure 14. The light emitting structure 14 is coupled on the pixel electrode 1528 and the passivation layer 1529. The first electrode 141 of the light emitting structure 14 is electrically coupled to the pixel electrode 1528.

The column drive circuit lines 153 are arranged in parallel. The column drive circuit lines 153 are coupled to the light emitting structures 14. The column drive circuit line 153 is electrically coupled to the second electrode 147 of the light emitting structure 14.

Each column drive circuit line 153 has an extending direction substantially perpendicular to an extending direction of the row drive circuit line 151. In at least one embodiment, the extending direction of the column drive line 153 is same to the direction from one frame portion 12 to the other frame portion 12.

In at least one embodiment, the OLED display panel 10 can further include an enclosure structure covering the light emitting structures 14 and the column drive circuit lines 153. The enclosure structure can be a micro lens or a plurality of micro lenses.

In at least one alternative embodiment, the driving structure 15 can omit the thin film transistor array 152. Here, the first electrode 141 of the light emitting structures 14 can be directly electrically coupled to the row drive circuit line 151 via the electrical conductive hole 134.

In at least one alternative embodiment, the light emitting structure 14 can consists of the first electrode 141, the organic light emitting layer 144 and the second electrode 147. Here, the organic light emitting layer 144 is sandwiched between the first electrode 141 and the second electrode 147.

In at least one alternative embodiment, the row drive circuit line 151 can be replaced by a driving chip array. Here, driving chips of the driving chip array are corresponding to the light emitting structures 14 one-to-one.

Figure 4:
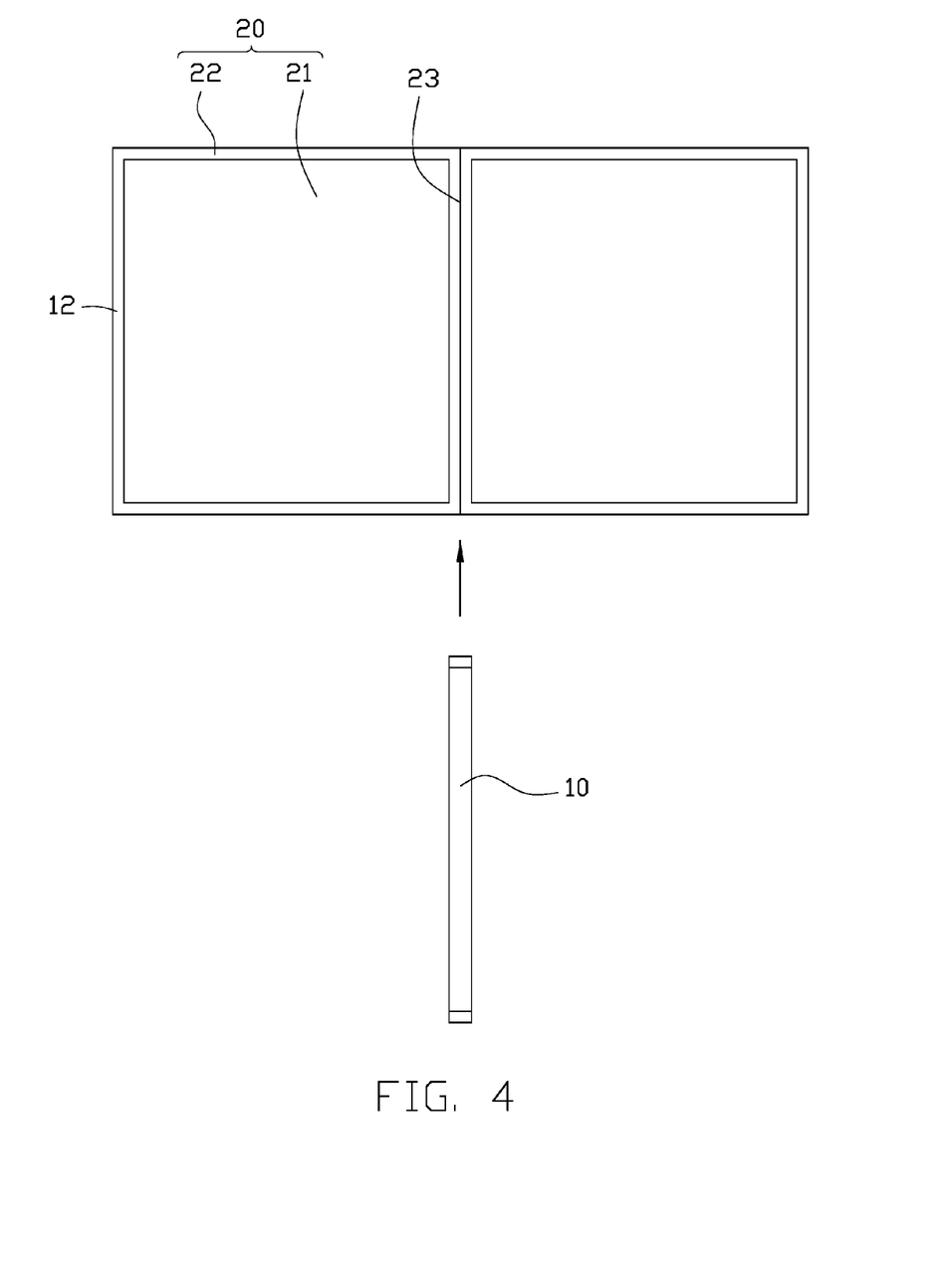
FIG. 4 is a diagrammatic view of a display device with the OLED display panel in FIG. 1, before the OLED display panel assembled to two display panels of the display device.
Figure 5:
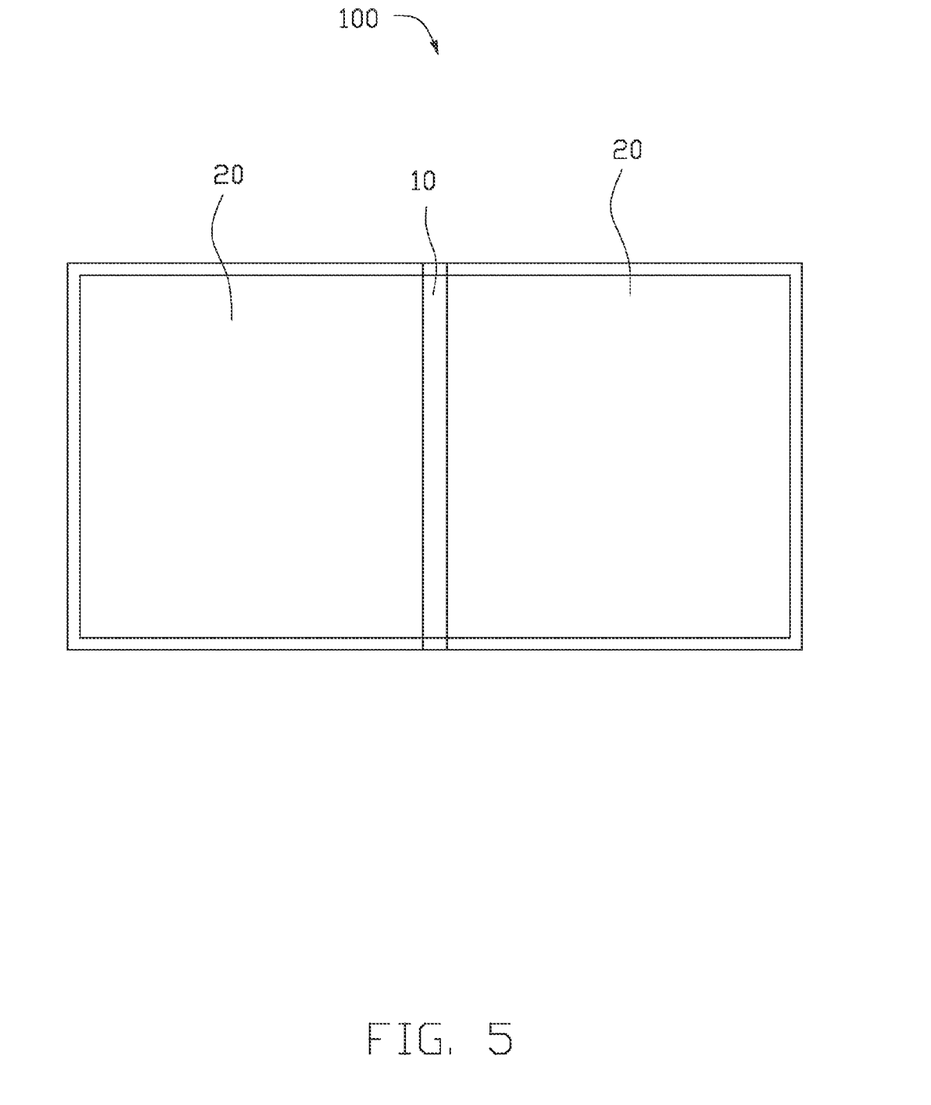
FIG. 5 a diagrammatic view of a display device with the OLED display panel in FIG. 1, after the OLED display panel assembled to two display panels of the display device.

FIG. 4 and FIG. 5 illustrate a display device 100 of an embodiment of the present disclosure. The display device 100 can include at least one OLED display panel 10 and at least two display panels 20 splicing together and coupled to the display panel 10. In the illustrated embodiment, the display device 100 includes one OLED display panel 10 and two display panels 20. The two display panels 20 are arranged side-by-side and spliced together. In the illustrated embodiment, the two display panels 20 are identical to each other. Each display panel 20 can be an LED (light emitting diode) display panel, LCD (liquid crystal display) panel or other display panel. In the illustrated embodiment, the display panel 20 is an LCD panel. Each display panel 20 can be rectangular, triangle, hexagon, or other polygonal plate. In the illustrated embodiment, the display panel 20 is rectangular.

The display panel 20 can include a display area 21 and a rim area 22 coupled to the display area 21. In the illustrated embodiment, the display area 21 is surrounded by the rim area 22. The rim areas 22 of the two display panels 20 are coupled to each other and collectively form a splicing area 23 between the two display areas 21.

The OLED display panel 10 is coupled to splicing area 23. The OLED display panel 10 entirely covers the splicing area 23. In the illustrated embodiment, the OLED display panel 10 has a shape and a size equal to a shape and a size of the splicing area 23 between the two display areas 21. The OLED display panel 10 has a width of the frame portion 12 equal to a width of the rim area 22.

The display device 100 can further include an image segmenting unit for segmenting images.

When the display device 100 is in use, the image segmenting unit will segment images needing to be displayed to be a first part which will be displayed by the display panels 20 and a second part which will be displayed by the OLED display panel 10. The first part and the second part of images are transmitted to the display panels 20 and the OLED display panel 10 to be displayed continuously and completely.

In at least one alternative embodiment, the display device 100 can further include an enclosure structure covering display faces of the OLED display panel 10 and the display panel 20. The enclosure structure can be a micro lens or a plurality of micro lenses.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. An OLED display panel comprising:
   a substrate defining an electrical conductive hole, the substrate having a first surface and a second surface opposite the first surface;
   a light emitting structure located at the first surface of the substrate and comprising a first electrode, a second electrode and an organic light emitting layer located between the first electrode and the second electrode; and
   a driving structure comprising a row drive circuit line coupled to the second surface of the substrate, and a column drive circuit line;
   wherein the first electrode is electrically coupled to the row drive circuit line via the electrical conductive hole, and the column drive circuit line is coupled to the light emitting structure, whereby the column drive circuit line is electrically coupled to the second electrode.

2. The OLED display panel of claim 1, wherein a distance between the first electrode and the substrate is less than a distance between the second electrode and the substrate.

3. The OLED display panel of claim 2, wherein the light emitting structure further comprises a hole injection layer, a hole transport layer, an electron injection layer and an electron transport layer; the first electrode, the hole injection layer, the hole transport layer, the organic light emitting layer, the electron transport layer, the electron injection layer and second electrode being successively stacked.

4. The OLED display panel of claim 2, wherein the driving structure further comprises a thin film transistor located between the light emitting structure and the substrate, the first electrode being electrically coupled to the row drive circuit line via the thin film transistor and the electrical conductive hole.

5. The OLED display panel of claim 4, wherein the electrical conductive hole extends through the substrate, and has diameters thereof decreased from the row drive circuit line to the thin film transistor.

6. The OLED display panel of claim 5, wherein the substrate comprises a base, a first isolating layer and a second isolating layer stacked together, the base being located between the first isolating layer and the second isolating layer, the row drive circuit line being coupled to an outer face of the first isolating layer.

7. The OLED display panel of claim 6, wherein the substrate is located between the row drive circuit line and the thin film transistor.

8. The OLED display panel of claim 7, wherein the electrical conductive hole extends through the first isolating layer, the base and the second isolating layer.

9. The OLED display panel of claim 8, wherein the electrical conductive hole has diameters thereof decreased from the first isolating layer to the second isolating layer.

10. The OLED display panel of claim 4, wherein the thin film transistor comprises a gate electrode electrically coupled to the row drive circuit line via the electrical conductive hole.

11. The OLED display panel of claim 10, wherein the thin film transistor comprises a pixel electrode, the first electrode of the light emitting structure being electrically coupled to the pixel electrode.

12. A display device comprising:
    two display panels spliced together, each of the display panels comprising a display area and a rim area coupled to the display area, the rim areas of the two display panels coupled to each other and collectively forming a splicing area between the display areas of the two display panels;
    an OLED display panel coupled to the two display panels and entirely covering the splicing area, the OLED display panel comprising a display portion comprising:
      a substrate defining an electrical conductive hole, the substrate having a first surface and a second surface opposite the first surface;
      a light emitting structure located at the first surface of the substrate and comprising a first electrode, a second electrode and an organic light emitting layer located between the first electrode and the second electrode; and
      a driving structure comprising a row drive circuit line coupled to the second surface of the substrate, and a column drive circuit line;
      wherein the first electrode is electrically coupled to the row drive circuit line via the electrical conductive hole, and the column drive circuit line is coupled to the light emitting structure, whereby the column drive circuit line is electrically coupled to the second electrode.

13. The display device of claim 12, wherein the display area is surrounded by the rim area of each of the display panels.

14. The display device of claim 12, wherein the OLED display panel has a shape and a size equal to a shape and a size of the splicing area between the display areas.

15. The display device of claim 12, wherein the OLED display panel further comprises two frame portions located at two opposite ends of the display portion.

16. The display device of claim 15, wherein each of the frame portions has a width equal to a width of the rim area.

17. The display device of claim 12, wherein the driving structure further comprises a thin film transistor located between the light emitting structure and the substrate, the first electrode being electrically coupled to the row drive circuit line via the thin film transistor and the electrical conductive hole.

18. The display device of claim 17, wherein the electrical conductive hole extends through the substrate, and has diameters thereof decreased from the row drive circuit line to the thin film transistor.

19. The display device of claim 17, wherein the thin film transistor comprises a gate electrode electrically coupled to the row drive circuit line via the electrical conductive hole.

20. The display device of claim 17, wherein the thin film transistor comprises a pixel electrode, the first electrode of the light emitting structure being electrically coupled to the pixel electrode.

* * * * *